United States Patent
Hiller

(10) Patent No.: US 9,382,902 B1
(45) Date of Patent: Jul. 5, 2016

(54) UNDERSEA ENERGY HARVESTING ELECTRICAL POWER STATION

(75) Inventor: Nathan Hiller, Irvine, CA (US)

(73) Assignee: The Boeing Company, Chicago, IL (US)

(*) Notice: Subject to any disclaimer, the term of this patent is extended or adjusted under 35 U.S.C. 154(b) by 1056 days.

(21) Appl. No.: 13/455,548

(22) Filed: Apr. 25, 2012

(51) Int. Cl.
| | | |
|---|---|---|
| *H01L 35/02* | (2006.01) | |
| *F03G 7/05* | (2006.01) | |
| *H01L 35/00* | (2006.01) | |
| *H01L 35/32* | (2006.01) | |
| *H01L 35/34* | (2006.01) | |
| *B63G 8/22* | (2006.01) | |
| *B63B 22/26* | (2006.01) | |

(52) U.S. Cl.
CPC . *F03G 7/05* (2013.01); *B63B 22/26* (2013.01); *B63G 8/22* (2013.01); *H01L 35/00* (2013.01); *H01L 35/32* (2013.01); *H01L 35/34* (2013.01); *Y02E 10/34* (2013.01)

(58) Field of Classification Search
CPC ............. Y02E 10/34; F03G 7/05; B63G 8/22; B63G 22/26
USPC ................. 136/200–242; 60/641.7, 495–507; 114/330, 331, 333
See application file for complete search history.

(56) References Cited

U.S. PATENT DOCUMENTS

| | | | | |
|---|---|---|---|---|
| 2,638,555 | A * | 5/1953 | Marks ............................. 310/11 | |
| 3,118,818 | A | 1/1964 | Bray | |
| 4,281,614 | A * | 8/1981 | McNary et al. ............... 114/264 | |
| 4,286,434 | A * | 9/1981 | Moisdon ...................... 60/641.7 | |
| 4,333,312 | A * | 6/1982 | Sorensen ..................... 60/641.7 | |
| 6,914,343 | B2 | 7/2005 | Hiller et al. | |
| 7,224,080 | B2 | 5/2007 | Smedstad | |
| 7,262,360 | B1 * | 8/2007 | Davis ............................ 136/205 | |
| 8,025,021 | B2 | 9/2011 | Gosling | |
| 8,065,972 | B2 | 11/2011 | Howard et al. | |
| 8,146,362 | B2 | 4/2012 | Howard et al. | |
| 2010/0139272 | A1 * | 6/2010 | Howard et al. ............. 60/641.7 | |
| 2010/0243016 | A1 * | 9/2010 | Awashima ............. F01K 25/10 136/205 | |
| 2011/0000952 | A1 * | 1/2011 | Takeshita et al. .......... 228/112.1 | |
| 2011/0011572 | A1 * | 1/2011 | Nagurny et al. ............... 165/172 | |

(Continued)

OTHER PUBLICATIONS

Abu Sharkh, S.M. et al., "Power Sources for Unmanned Underwater Vehicles," In: Griffiths, G. (ed), Technology and applications of autonomous underwater vehicles. Taylor and Francis, London, p. 19-35, 2003.

(Continued)

*Primary Examiner* — Eli Mekhlin
*Assistant Examiner* — Liesl C Baumann
(74) *Attorney, Agent, or Firm* — Baldauff IP, LLC; Michael J. Baldauff, Jr.

(57) ABSTRACT

The present disclosure is generally directed to a method, system and an apparatus that includes a hollow canister including a top portion and a bottom portion, the top portion including a top opening and the bottom portion including a bottom opening. The hollow canister additional includes an inner compartment within the hollow canister, the inner compartment being porous to allow fluid transfer across the inner compartment, a neutral buoyancy device, a variable buoyancy device, and a thermoelectric module lining an inner portion of the hollow canister. The thermoelectric module generates electricity based on a temperature difference of between an interior temperature the hollow canister and an exterior temperature on a periphery of the hollow canister.

17 Claims, 4 Drawing Sheets

(56) References Cited

U.S. PATENT DOCUMENTS

2012/0080175 A1* 4/2012 Levings et al. ............... 165/185
2013/0146437 A1* 6/2013 Maurer et al. ............. 202/185.1

OTHER PUBLICATIONS

Blidberg, D.R. et al., "Solar Powered Autonomous Underwater Vehicles," In: Griffiths, G. (ed), Technology and applications of autonomous underwater vehicles. Taylor and Francis, London, p. 59-76, 2003.

Davis, R.E et al., "Autonomous Buoyancy-Driven Underwater Gliders," In: Griffiths, G. (ed), Technology and applications of autonomous underwater vehicles. Taylor and Francis, London, p. 37-58, 2003.

Galathea 3 "Sea Surface Temperature, SST Measured from Space," [http://galathea3.emu.dk/satelliteeye/projekter/sst/back_uk.html] 2011.

Snyder, G.J et al., "Thermoelectric Devices," Nature Materials 7, p. 10-5-114, 2008. [http://www.nature.com/nmat/journal/v7/n2/box/nmat2090_BX1.html].

* cited by examiner

UNDERSEA ENERGY HARVESTING ELECTRICAL POWER STATION

FIELD OF INVENTION

The embodiments presented herein relate to electrical power generation in general, and, more particularly, to fluid thermal energy conversion to electrical energy by means of a thermoelectric device.

BACKGROUND

Harvesting ocean thermal energy by conversion to electrical power utilizes temperature differences between thermocline boundaries within the oceans. However, this same energy conversion may be utilized in any environment presenting a thermal differential between two bodies of fluid. Generally, devices that generate electrical energy from such temperature differences are called thermoelectric generators, (also called thermogenerators), which convert heat directly into electrical energy based on a phenomenon called the "Seebeck effect," (or "thermoelectric effect"). Older Seebeck-based devices used bimetallic junctions and were bulky, while more recent devices use bismuth telluride (Bi2Te3) semiconductor p-n junctions and can have thicknesses in the millimeter range. These are solid state devices having no moving parts.

There is a need for a simple mechanical device that exploits the thermal differentials between two bodies of fluid and is able to store the generated electrical energy and later transfer the electrical energy to other devices. It is with respect to these and other considerations that the disclosure herein is presented.

SUMMARY

It should be appreciated that this Summary is provided to introduce a selection of concepts in a simplified form that are further described below in the Detailed Description. This Summary is not intended to be used to limit the scope of the claimed subject matter.

In one embodiment disclosed herein, a thermogenerator apparatus includes a hollow canister including a top portion and a bottom portion, the top portion including a top opening and the bottom portion including a bottom opening. The hollow canister additionally includes a porous inner compartment within the hollow canister to allow fluid transfer across the inner compartment, a neutral buoyancy device, a variable buoyancy device, and a thermoelectric module lining an inner portion of the hollow canister. The thermoelectric module generates electricity based on a temperature difference between an interior temperature of the hollow canister and an exterior temperature on a periphery of the hollow canister.

In another embodiment disclosed herein, a system generates electrical energy from a fluid temperature differential that includes a hollow canister having a top portion including a top opening and a bottom portion including a bottom opening. The hollow canister additionally includes a porous inner compartment within the hollow canister that allows a fluid transfer across the inner compartment. The inner compartment additionally includes a neutral buoyancy device, a variable buoyancy device, and a thermoelectric module lining an inner portion of the hollow canister. The thermoelectric module generates electricity based on a temperature difference between an interior temperature of the hollow canister and an exterior temperature on a periphery of the hollow canister. The system further includes an electrical storage module connected to the thermoelectric module that stores electrical energy generated by the thermoelectric module, and an electrical interconnection fitting connected to the electrical storage module that transfers electrical energy stored in the electrical storage module.

In another embodiment disclosed herein, a method generates electrical energy from a fluid temperature differential by providing a hollow canister that includes a top portion with a top opening and a bottom portion with a bottom opening, and an inner porous compartment within the hollow canister that allows fluid transfer across the inner compartment. The inner compartment further including a neutral buoyancy device, a variable buoyancy device and a thermoelectric module lining the inner portion of the hollow canister. The method further includes causing the variable buoyancy device to become positively buoyant and provide an upward force on the hollow canister so that the hollow canister moves in an upward direction, and causing the neutral buoyancy device to move away from the top opening. An interior portion of the hollow canister is filled with a first fluid through the top opening while any existing fluid in the interior portion of the hollow canister exits through the bottom opening. The variable buoyancy device is caused to become negatively buoyant and provide a downward force on the hollow canister so that the hollow canister moves in a downward direction. Thereafter, the neutral buoyancy device is caused to obstruct the top opening, thereby preventing the interior portion of the hollow canister to fill with fluid through the bottom opening as a result of the neutral buoyancy device obstructing the top opening. Finally, electrical energy is generated from the thermoelectric module based on a temperature difference between an interior temperature of the first fluid in the interior portion of the hollow canister and an exterior temperature of a second fluid contacting the periphery of the hollow canister.

In another embodiment disclosed herein, a method for converting thermal energy into electrical power includes enclosing a first volume of fluid, displacing the first volume of fluid into a location of a second body of fluid, and exchanging thermal energy between the first volume of fluid and the second body of fluid. The thermal energy is converted to electrical power, and then the first volume of fluid is displaced by using the electrical power, to thereby release the first volume of fluid from being enclosed.

The features, functions, and advantages that have been discussed can be achieved independently in various embodiments of the present disclosure or may be combined in yet other embodiments, further details of which can be seen with reference to the following description and drawings.

BRIEF DESCRIPTION OF THE DRAWINGS

The embodiments presented herein will become more fully understood from the detailed description and the accompanying drawings, wherein.

DETAILED DESCRIPTION

Generally, the embodiments presented herein provide a device that generates a temperature differential between an interior and exterior of the device through mechanical means and the movement of the device through a body of fluid that provides a temperature differential. The temperature differential between the interior and exterior of the device is then used to generate power that can be stored or transferred.

The embodiments presented herein include a mechanical device that operates to create a temperature differential between a fluid inside the device and a fluid outside the device. Thermoelectric modules disposed on the inside of the mechanical device utilize the temperature differential to generate electricity that can be directly consumed or stored for later transfer to transmission lines or undersea vehicles that do not need to surface for lack of power reasons. The embodiments presented herein are particularly suitable to the general problem that undersea vehicles have limited power sources, (i.e., battery, capacitor, fuel cell), and nuclear power sources are not practical for every undersea vehicle.

Figure 1:
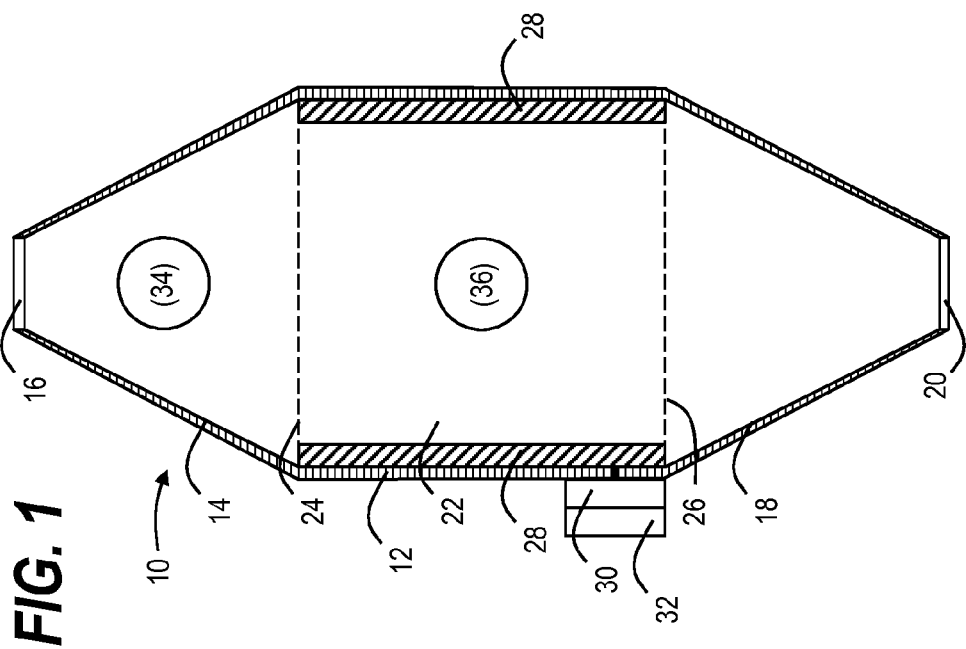
FIG. 1 illustrates a cross sectional view of one embodiment of an apparatus according to at least one embodiment disclosed herein.

FIG. 1 illustrates a cross sectional view of one embodiment a thermogenerator apparatus 10 that includes a hollow canister 12 being cylindrically shaped and including a cone shaped top portion 14 with a top opening 16 and a cone shaped bottom portion 18 with a bottom opening 20. Cone shaped top portion 14 and cone shaped bottom portion 18 may be tapered to distal ends of the hollow canister 12 to allow more efficient travel through a fluid medium in a vertically oriented direction. FIG. 1 illustrates the hollow canister 12 with a cone shaped top portion 14 and cone shaped bottom portion 18, however, these shapes are non-limiting as other equally effective shapes may be used for the purposes of carrying out the scope of the embodiments presented herein.

A centrally located inner compartment 22 of the hollow canister 12 is defined by two opposing porous screens, an upper porous screen 24 and a lower porous screen 26 that are configured to allow fluid to pass through the centrally located inner compartment 22 in both an upward and downward direction. The upper porous screen 24 and lower porous screen 26 may extend toward the lower and upper extremities of the cone shaped top portion 14 and cone shaped bottom portion 18, respectively, (as shown), or may be located within a central portion of the hollow canister 12, away from the cone shaped top portion 14 and cone shaped bottom portion 18.

A thermoelectric module 28 lines an inner portion of the thermogenerator apparatus 10. In FIG. 1, the thermoelectric module 28 lines a central portion of the hollow canister 12. However, in another embodiment, (not shown), the thermoelectric module 28 may completely or partially line the interior of the cone shaped top portion 14 and cone shaped bottom portion 18. The thermoelectric module 28 may include an array of bismuth telluride (Bi2Te3) semiconductor p-n junctions that produce electrical energy due to a temperature difference between opposite sides of the p-n junctions.

The thermogenerator apparatus 10 may also include an electrical storage module 30 connected to the thermoelectric module 28 that stores electrical energy generated by the thermoelectric module 28. Additionally, an electrical interconnection fitting 32 connected to the electrical storage module 30 may allow the transfer of electrical energy stored in the electrical storage module 30 to devices needing the stored electrical energy. The electrical interconnection fitting 32 may take the form of any necessary terminal connection designed to interface with devices that collect the electrical energy from the thermogenerator apparatus 10.

Inside the thermogenerator apparatus 10, between the upper porous screen 24 and the top opening 16 of the cone shaped top portion 14 of the hollow canister 12 is a neutral buoyancy device 34. The neutral buoyancy device 34 is sized to be retained within the boundaries of the upper porous screen 24 and the top opening 16. More specifically, the shape of the neutral buoyancy device 34 allows it to plug the top opening 16 when the neutral buoyancy device 34 is moved in an upward direction to interface with the top opening 16, and then to be easily removed from the top opening 16 by moving in a downward position. The neutral buoyancy device 34 is illustrated in a spherical configuration, but may be shaped in any configuration to accomplish the same objectives. Additionally, the neutral buoyancy device 34 is configured to be neutral buoyancy in a fluid that the thermogenerator apparatus 10 is placed in. One embodiment presented herein is for the thermogenerator apparatus 10 to be submersed in seawater. Thus, the neutral buoyancy device 34 would have the specific density of approximately that of seawater, or any particular seawater environment (given any specific salinity levels or water temperatures) where it would be operating.

A variable buoyancy device 36 is located within the centrally located inner compartment 22, captured between the upper porous screen 24 and the lower porous screen 26. The variable buoyancy device 36 is responsible for providing a buoyant force greater than the weight of thermogenerator apparatus 10 in whatever fluid media it is placed in, such that the thermogenerator apparatus 10 become positively buoyant to move in an upward direction through the fluid media. The variable buoyancy device 36 in this state would be retained by the upper porous screen 24 as the thermogenerator apparatus 10 move upwardly.

The variable buoyancy device 36 may also reverse its positively buoyant force and become either neutral buoyancy or negatively buoyant which then causes the thermogenerator apparatus 10 to become negatively buoyant and move in a downward direction through the fluid media. If the variable buoyancy device 36 becomes negatively buoyant, it would be retained by the lower porous screen 26 as the thermogenerator apparatus 10 move downwardly. The variable buoyancy device 36 is illustrated in a spherical configuration, but may be shaped in any configuration to accomplish the same objectives.

Additionally, the material used in construction of the thermogenerator apparatus 10 (the hollow canister in particular) may be either neutral buoyancy or negatively buoyant to allow for the variable buoyancy device 36 to either move or cause the thermogenerator apparatus 10 to descend in the downward direction, respectively, based on its own buoyancy. For example, the hollow canister 12 may be constructed of a material that has a specific density lighter than that of the fluid it is designed to operate within such that its positive buoyancy may offset the negative buoyancy effects of the thermoelectric module 28, the upper porous screen 24 and lower porous screen 26, and the electrical storage module 30 and the electrical interconnection fitting 32, thus causing the thermogenerator apparatus 10 to be neutral buoyancy in the specified fluid.

In the alternative, the hollow canister 12 may be constructed of a material that has a specific density heavier than that of the fluid it is designed to operate within so that with the inclusion of the thermoelectric module 28, the upper porous screen 24 and lower porous screen 26, and the electrical storage module 30 and the electrical interconnection fitting 32, the thermogenerator apparatus 10 may be negatively buoyant in the specified fluid.

FIG. 2A illustrates one embodiment of a method of operation that generates electrical energy from a fluid temperature differential using the apparatus of FIG. 1 during one phase of a method of use. In an undersea application, the thermogenerator apparatus 10 causes the variable buoyancy device 36 to become positively buoyant to offset the weight of the thermogenerator apparatus 10 in the fluid media it is operating within. The variable buoyancy device 36 rises in an upward direction 200 within the confines of the upper porous screen 24 within the centrally located inner compartment 22 to exert a buoyant force $F_B$ on the thermogenerator apparatus 10 via the upper porous screen 24. The as the thermogenerator apparatus 10 rises in the upward direction 200 though the fluid media that it operates within, intake fluid I enters the top opening 16 and displaces the neutral buoyancy device 34 so that it moves downward, under the influence of the entering intake fluid I, until it is restrained on the opposite side of the upper porous screen 24 where the variable buoyancy device 36 is impinging itself thereupon.

As the thermogenerator apparatus 10 travels in the upward direction 200, output fluid O exits from the bottom opening 20 while external fluid F travels around the periphery of the thermogenerator apparatus 10. Thermogenerator apparatus 10 rises until the entire interior of the hollow canister 12 is filled with fluid having a first temperature $T_1$. This first temperature $T_1$ may be dependent upon the particular depth of thermogenerator apparatus 10, or it may be more generally be dependent on a particular location the thermogenerator apparatus 10 is located with respect to another portion of fluid at a different temperature.

FIG. 2B illustrates one embodiment of the apparatus of FIG. 1 during a second phase of a method of use where the variable buoyancy device 36 reverses its positive buoyancy and become either neutral buoyancy or negatively buoyant to cause the thermogenerator apparatus 10 to descend in a downward direction 210 within the fluid media. As it moves in a downward direction, the variable buoyancy device 36 is restricted from moving below the lower porous screen 26 and is retained within the centrally located inner compartment 22. A small amount of fluid B moves into the bottom opening 20 causing the neutral buoyancy device 34 to rise and plug the top opening 16. When the top opening 16 is blocked by the neutral buoyancy device 34, the fluid B is effectively blocked from entering the bottom opening 20 and the thermogenerator apparatus 10 continues to move in a downward direction 210 while external fluid F travels around the periphery of the thermogenerator apparatus 10. In this state, the fluid at the first temperature $T_1$ that filled the thermogenerator apparatus 10 as it rose in the upward direction 200 is now trapped inside as the thermogenerator apparatus 10 descends in the downward direction 210.

FIG. 2C illustrates one embodiment of the apparatus of FIG. 1 during a third phase of a method of use where the thermogenerator apparatus 10 descends to an area or a depth having a second temperature $T_2$, such that the difference in temperature between the first temperature $T_1$ and the second temperature $T_2$ is effective to produce electrical energy due to a thermodynamic transfer of heat (HX) between the interior of the thermogenerator apparatus 10 across the thermoelectric module 28 to the exterior fluid surrounding the thermogenerator apparatus 10. The electrical energy is then stored in the electrical storage module 30 (shown in FIG. 1) via an electrical connection to the thermoelectric module 28, wherein an electrical interconnection fitting 32 (shown in FIG. 1) is connected to the electrical storage module 30 may allow the transfer of the stored electrical energy to any device seeking to receive the electrical energy.

Figure 3:
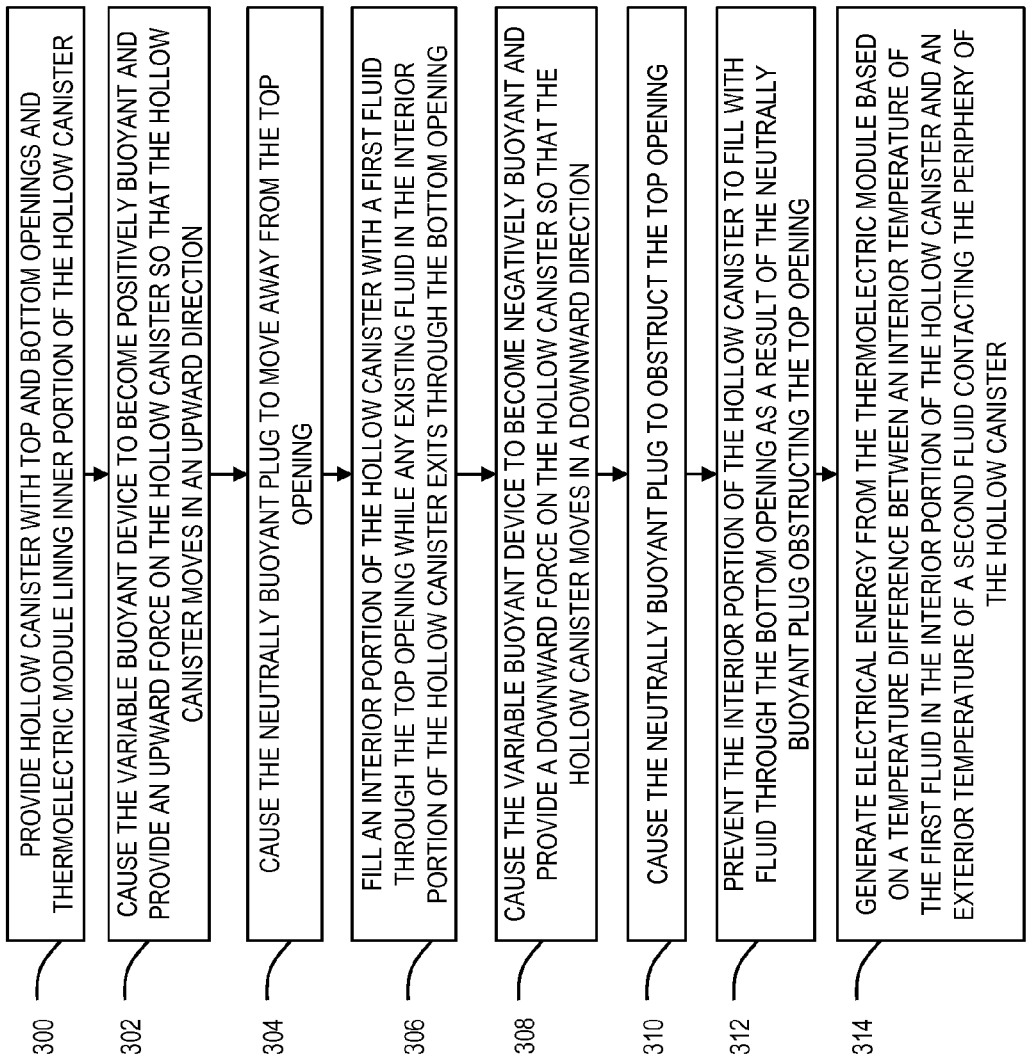
FIG. 3 illustrates a flow chart diagram of a method according to one embodiment presented herein.

FIG. 3 illustrates a flow chart diagram of a method according to one embodiment presented herein that generates electrical energy from a fluid temperature differential. The method includes providing 300 a hollow canister having a top portion and a bottom portion, the top portion including a top opening and the bottom portion including a bottom opening. An inner compartment within the hollow canister is porous to allow fluid transfer across the inner compartment. The hollow canister further includes a neutral buoyancy device, a variable buoyancy device, and a thermoelectric module lining an inner portion of the hollow canister.

The method further includes causing 302 the variable buoyancy device to become positively buoyant and provide an upward force on the hollow canister so that the hollow canister moves in an upward direction. As the hollow canister moves upwardly, fluid filling into the top opening 16 causes 304 the neutral buoyancy device to move away from the top opening, thus filling 306 an interior portion of the hollow canister with a first fluid through the top opening while any existing fluid in the interior portion of the hollow canister exits through the bottom opening.

When the process of filling the hollow container with fluid of a first temperature $T_1$ is accomplished, the variable buoyancy device is caused 308 to become negatively buoyant and provide a downward force on the hollow canister so that the hollow canister moves in a downward direction. As this happens, fluid entering through the bottom opening 20 causes 310 the neutral buoyancy device to obstruct the top opening, thus preventing 312 the interior portion of the hollow canister to fill with fluid through the bottom opening as a result of the neutral buoyancy device obstructing the top opening.

Finally, electrical energy is generated 314 from the thermoelectric module based on a temperature difference between an interior temperature ($T_1$) of the first fluid in the interior portion of the hollow canister and an exterior temperature ($T_2$) of a second fluid contacting the periphery of the hollow canister. The method further includes providing an electrical storage module connected to the thermoelectric module, and storing the electrical energy in the electrical storage module generated by the thermoelectric module. If any devices are configured to extract the electrical energy from the thermogenerator apparatus 10, then the method includes providing an electrical interconnection fitting connected to the electrical storage module, and transferring the electrical energy stored in the electrical storage module to any properly configured device.

The method further includes reversing the buoyancy of the variable buoyancy device when the process of generating electrical energy is substantially complete to cycle the thermogenerator apparatus 10 to rise and collect fluid at the first temperature $T_1$ such that the electrical energy generation and storage method may be repeated. The motion of the thermogenerator apparatus 10 is dependent upon the variable buoyant device which exerts the upward force on an upper portion of the inner compartment when positively buoyant, and exerts the downward force on a lower portion of the inner compartment when negatively buoyant.

Figure 2:
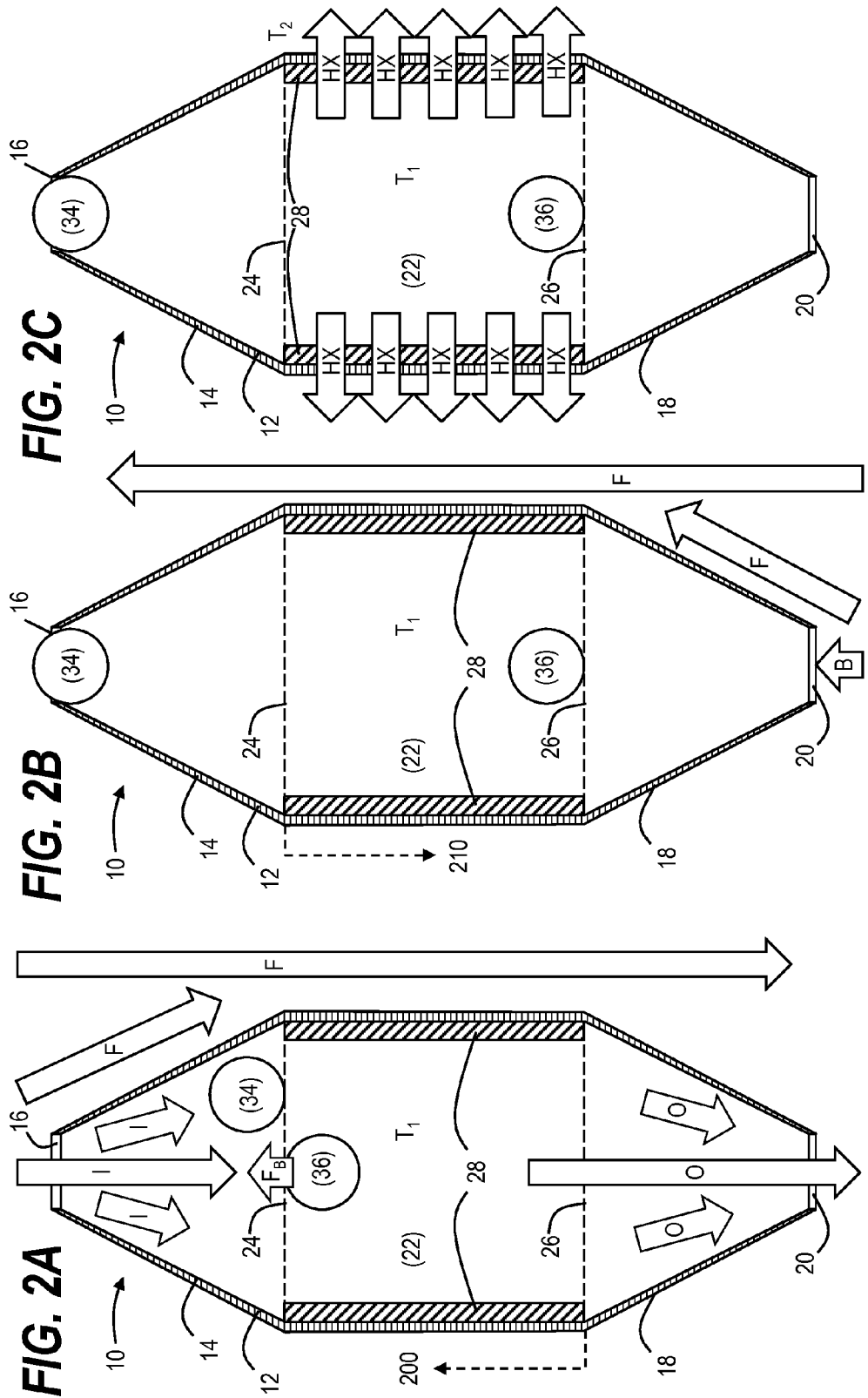
FIG. 2A illustrates a cross sectional view of one embodiment of a method of operation that generates electrical energy from a fluid temperature differential using the apparatus of FIG. 1 during one phase of a method of use according to at least one embodiment disclosed herein.
FIG. 2B illustrates a cross sectional view of one embodiment of a method of operation that generates electrical energy from a fluid temperature differential using the apparatus of FIG. 1 during a second phase of a method of use according to at least one embodiment disclosed herein.
FIG. 2C illustrates a cross sectional view of one embodiment of a method of operation that generates electrical energy from a fluid temperature differential using the apparatus of FIG. 1 during a third phase of a method of use according to at least one embodiment disclosed herein.
Figure 4:
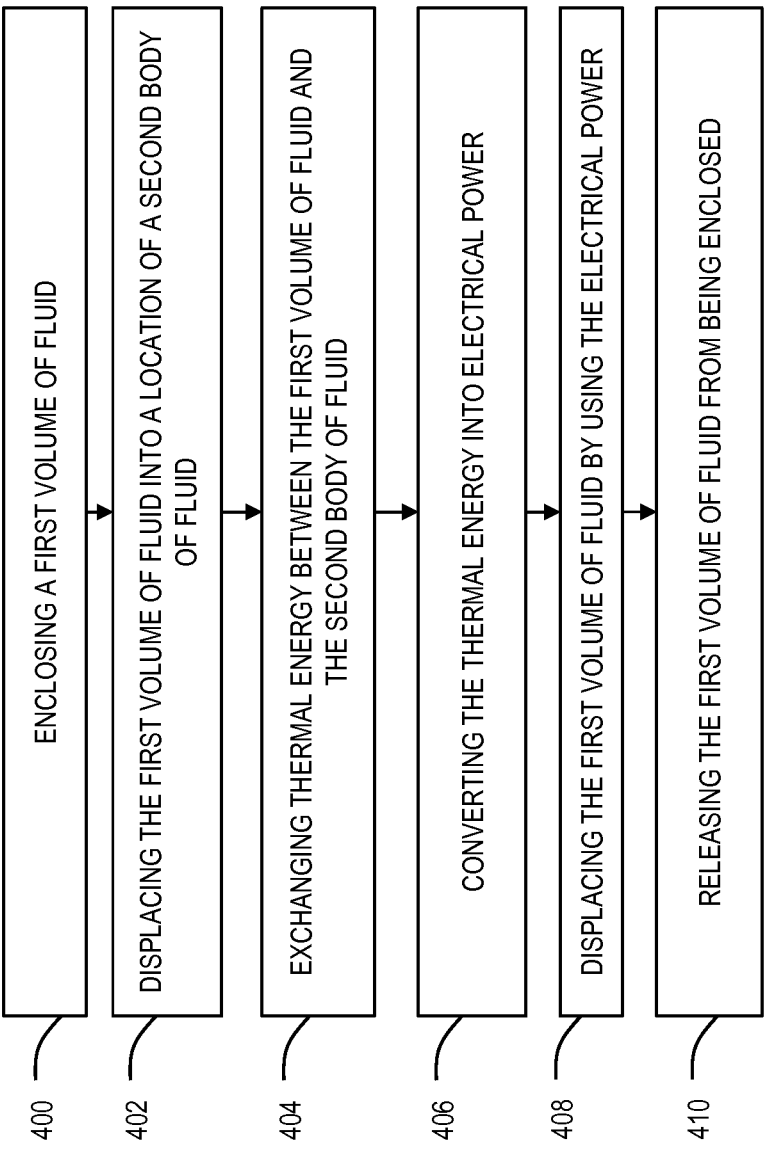
FIG. 4 illustrates a flow chart diagram of a method according to another embodiment presented herein.

FIG. 4 illustrates another simplified embodiment presented herein that includes a method for converting thermal energy into electrical power by enclosing 400 a first volume of fluid, displacing 402 the first volume of fluid into a location of a second body of fluid, and exchanging 404 thermal energy between the first volume of fluid and the second body of fluid. The thermal energy is converted 406 to electrical power, and then the first volume of fluid is displaced 408 by using the electrical power, to thereby release 410 the first volume of fluid from being enclosed. In this embodiment, the electrical energy may cause the variable buoyancy device 36 of FIGS. 1-2C to change buoyancy to become positively buoyant as illustrated in FIG. 2A and its related discussion above.

The subject matter described above is provided by way of illustration only and should not be construed as limiting. Various modifications and changes may be made to the subject matter described herein without following the example embodiments and applications illustrated and described, and without departing from the true spirit and scope of the present disclosure, which is set forth in the following claims.

The invention claimed is:

1. An apparatus comprising:
   a hollow canister including a top portion and a bottom portion;
   an inner compartment within the hollow canister, the inner compartment being porous to allow fluid transfer across the inner compartment;
   a neutral buoyancy device located in the top portion and outside of the inner compartment of the hollow canister;
   a variable buoyancy device located inside the inner compartment of the hollow canister; and
   a thermoelectric module within the hollow canister, the thermoelectric module configured to generate electricity based on a temperature difference of between an interior temperature the hollow canister and an exterior temperature on a periphery of the hollow canister, wherein
   the top portion is tapered away from the inner compartment to a top tapered end, where the top portion is open at the top tapered end to form a top opening, and
   the bottom portion is tapered away from the inner compartment to a bottom tapered end, where the bottom portion is open at the bottom tapered end to form a bottom opening.

2. The apparatus of claim 1, wherein the inner compartment further comprises:
   a porous top barrier and a porous bottom barrier,
   wherein the variable buoyancy device is contained within the inner compartment between the porous top barrier and the porous bottom barrier.

3. The apparatus of claim 1, wherein the neutral buoyancy device being dimensioned to plug the top opening of the top portion of the hollow canister.

4. The apparatus of claim 1, wherein:
   in a first mode of operation, the variable buoyancy device is operable to exert an upward force upon the hollow canister configured to cause the hollow canister to become positively buoyant; and
   in a second mode of operation, the variable buoyancy device is operable to exert a downward force upon the hollow canister configured to cause the hollow canister to become negatively buoyant.

5. The apparatus of claim 1, wherein the thermoelectric module comprises a lining along an inner portion of the hollow canister.

6. A system that generates electrical energy from a fluid temperature differential, the system comprising:
   a hollow canister including a top portion and a bottom portion;
   an inner compartment within the interior of the hollow canister, the inner compartment being porous, fluidly connecting the top portion to the inner compartment to the bottom portion;
   a neutral buoyancy device located in the top portion and outside of the inner compartment of the hollow canister;
   a variable buoyancy device located inside the inner compartment of the hollow canister;
   a thermoelectric module within the hollow canister, the thermoelectric module configured to generate electrical energy based on a temperature difference of between a temperature within the hollow canister and an exterior temperature on the periphery of the hollow canister; and
   an electrical storage module connected to the thermoelectric module that stores electrical energy generated by the thermoelectric module, wherein
   the top portion is tapered away from the inner compartment to a top tapered end, where the top portion is open at the top tapered end to form a top opening, and
   the bottom portion is tapered away from the inner compartment to a bottom tapered end, where the bottom portion is open at the bottom tapered end to form a bottom opening.

7. The system of claim 6, wherein the inner compartment further comprises:
   a porous top barrier and a porous bottom barrier,
   wherein the variable buoyancy device is contained within the inner compartment between the porous top barrier and the porous bottom barrier.

8. The system of claim 6 further comprising an electrical interconnection fitting connected to the electrical storage module, the fitting operable for transfer of electrical energy stored in the electrical storage module to an external device.

9. The system of claim 6, wherein the neutral buoyancy device being dimensioned to plug the top opening of the top portion of the hollow canister.

10. The system of claim 6, wherein the variable buoyancy device is operable to exert an upward force upon the hollow canister configured to cause the hollow canister to become positively buoyant.

11. The system of claim 6, wherein the variable buoyancy device is operable to exert a downward force upon the hollow canister configured to cause the hollow canister to become negatively buoyant.

12. A method of operation that generates electrical energy from a fluid temperature differential, the method comprising:
   causing a variable buoyancy device to become positively buoyant and provide an upward force on a hollow canister so that the hollow canister moves in an upward direction such that a neutral buoyancy device within the hollow canister moves away from a top opening in the hollow canister, the hollow canister including:
   a top portion and a bottom portion;
   an inner compartment within the hollow canister, the inner compartment being porous to allow fluid transfer across the inner compartment;
   the neutral buoyancy device located outside of the inner compartment of the hollow canister;
   the variable buoyancy device located inside the inner compartment of the hollow canister; and
   a thermoelectric module proximate an inner portion of the hollow canister, wherein the top portion is tapered away from the inner compartment to a top tapered end, where the top portion is open at the top tapered end to form the top opening, and the bottom portion is tapered away from the inner compartment to a bottom tapered end, where the bottom portion is open at the bottom tapered end to form a bottom opening;

filling an interior portion of the hollow canister with a first fluid through the top opening while any existing fluid in the interior portion of the hollow canister exits through the bottom opening;

causing the variable buoyancy device to become negatively buoyant and provide a downward force on the hollow canister so that the hollow canister moves in a downward direction such that the neutral buoyancy device obstructs the top opening;

preventing the interior portion of the hollow canister to fill with fluid through the bottom opening as a result of the neutral buoyancy device obstructing the top opening; and generating electrical energy from the thermoelectric module based on a temperature difference between an interior temperature of the first fluid in the interior portion of the hollow canister and an exterior temperature of a second fluid contacting the periphery of the hollow canister.

13. The method according to claim 12, further comprising:
connecting an electrical storage module to the thermoelectric module; and
storing the electrical energy generated by the thermoelectric module in the electrical storage module.

14. The method according to claim 13, further comprising:
connecting an electrical interconnection fitting to the electrical storage module; and
transferring the electrical energy stored in the electrical storage module via the electrical interconnection fitting.

15. The method according to claim 12, further comprising:
reversing the buoyancy of the variable buoyancy device when the process of generating electrical energy is substantially complete.

16. The method according to claim 12, wherein causing the variable buoyancy device to become positively buoyant comprises exerting the upward force on an upper portion of the inner compartment with the variable buoyant device.

17. The method according to claim 12, wherein causing the variable buoyancy device to become negatively buoyant comprises exerting the downward force on a lower portion of the inner compartment with the variable buoyant device.

* * * * *